(12) United States Patent
Lin et al.

(10) Patent No.: US 10,797,059 B2
(45) Date of Patent: Oct. 6, 2020

(54) METHOD OF DESIGNING A LAYOUT OF A STATIC RANDOM ACCESS MEMORY PATTERN

(71) Applicant: UNITED MICROELECTRONICS CORP., Hsin-Chu (TW)

(72) Inventors: Yu-Chang Lin, Taichung (TW); Wei-Cyuan Lo, Taichung (TW); Yung-Feng Cheng, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 92 days.

(21) Appl. No.: 16/234,441

(22) Filed: Dec. 27, 2018

(65) Prior Publication Data

US 2020/0212052 A1 Jul. 2, 2020

(51) Int. Cl.
*H01L 27/11* (2006.01)
*G06F 30/39* (2020.01)

(52) U.S. Cl.
CPC .......... *H01L 27/1104* (2013.01); *G06F 30/39* (2020.01)

(58) Field of Classification Search
CPC ............... H01L 27/1104; G06F 30/39

USPC .......................................... 438/586
See application file for complete search history.

(56) References Cited

U.S. PATENT DOCUMENTS

| | | |
|---|---|---|
| 7,202,148 B2 | 4/2007 | Chen |
| 8,959,466 B1* | 2/2015 | Hsu ............ G03F 1/70 716/55 |
| 9,122,832 B2* | 9/2015 | Reed ............ G06F 30/398 |
| 2014/0367785 A1 | 12/2014 | Shieh |
| 2015/0072527 A1 | 3/2015 | Ng |

* cited by examiner

*Primary Examiner* — Caleen O Sullivan
(74) *Attorney, Agent, or Firm* — Winston Hsu

(57) ABSTRACT

The present invention provides a method of designing a layout of a static random access memory (SRAM) pattern, the method includes the following steps: firstly, a target pattern is provided, and according to the target pattern, a plurality of first patterns and a first dummy pattern are formed in a substrate, the first pattern that disposed at the outermost boundary of the first patterns is defined as a first edge pattern, and the first dummy pattern is disposed adjacent to the first edge pattern, next, the first dummy pattern is removed, and afterwards, according to the target pattern, a plurality of second patterns are formed in the substrate, the second patterns comprises a second edge pattern that is disposed between the first edge pattern and an original position of the first dummy pattern.

19 Claims, 4 Drawing Sheets

METHOD OF DESIGNING A LAYOUT OF A STATIC RANDOM ACCESS MEMORY PATTERN

BACKGROUND OF THE INVENTION

1. Field of the Invention

This application relates to design rules and, more particularly, to design rules of dummy devices.

2. Description of the Prior Art

The existence of pattern loading effect in films has been well known. There is a problem that a micro-loading effect occurs due to a difference in pattern density and degrades the uniformity of pattern sizes. The micro-loading effect pertains to a phenomenon occurring upon simultaneously etching or polishing a pattern of a higher density and a pattern of a lower density. Due to a difference in the etching/polishing rate of a film from one location to another, the amount of reaction produced by the etching/polishing becomes locally dense or sparse, and the convection of a large amount of reaction products by etching with a low volatility causes a non-uniformity in the etching rate. Large variations in effective pattern density have been shown to result in significant and undesirable effects such as pattern dimension deviation, critical dimension uniformity (CDU), and thickness variation.

To counteract this effect, a layout design step known as dummy fill, where the circuit layout is modified and dummy patterns are added to locations with low pattern density, was developed. The adding of dummy patterns helps to achieve uniform effective pattern density across the wafer, therefore avoiding problems.

Usually, such dummy patterns are left in place. In the case dummy patterns are conductive, they form parasitic capacitance with the interlayer metal wiring. The parasitic capacitance contributes to the RC time delay due to charging and discharging time. The scaling scheme of ILD and higher operation frequency for advanced process will cause severe performance degradation due to unwanted parasitic capacitance. At the present stage of the development of the integrated circuit art, there is an increasing demand in the field of digital integrated circuits for faster switching circuits. As when the switching demands of the integrated circuits go into higher frequency, the slowing effect produced by parasitic capacitance becomes an increasing problem.

Since dummy patterns are not removed, they cannot be formed in an active region, or oxide defined (OD) region. Leftover dummy patterns not only increase parasitic capacitance and degrade device performance, but also affect the subsequent processes. One of the conventional solutions is to place dummy patterns surrounding, but not in, the active regions. Not being able to be placed in desired regions, the effect of the dummy patterns is significantly limited. Such an arrangement also increases the difficulty of fine-tuning the dummy patterns. There were also efforts made to put dummy patterns into dummy active regions (DODs), surrounding dummy regions, or regions having neither an oxide nor an active device. However, the results have generally not proven satisfactory.

There is another effect that also affects the semiconductor process. When two devices are too close to each other, optical proximity effects occur. Optical proximity effects are due to light diffraction and interference between closely spaced features on the reticle resulting in the widths of lines in the lithographic image being affected by other nearby features. One component of the proximity effect is optical interaction among neighboring features; other components arise from similar mechanisms in the resist and etch processes.

The micro-loading and proximity effects affect the gate formation of the MOS devices. The critical dimension, or the gate length of a MOS device, may deviate significantly from design. For example, if an 80 nm gate length is desired, when the critical dimension of a MOS device in a dense device area is on target at 80 nm, the critical dimension of a MOS device in an isolated device area may reach around 110 nm, or 30 nm more than the target value in certain cases. Also the deviations for nMOS and pMOS gates are different, causing N/P ratio mismatching and complicating circuit design.

While advantages of using dummy patterns in IC fabrication are appreciated in the art, many problems remain regarding dummy pattern structure and arrangement. For example, such problems may include device critical dimension control, optical proximity effects, optical proximity correction (OPC) cycle-time, design complexity, device mismatch, and process window and yield. Accordingly, there remains in semiconductor manufacturing a need for simplified yet robust dummy patterns.

SUMMARY OF THE INVENTION

The present invention provides a method of designing a layout of a static random access memory (SRAM) pattern, the method includes the following steps: firstly, a target pattern is provided, and according to the target pattern, a plurality of first patterns and a first dummy pattern are formed in a substrate, the first pattern that disposed at the outermost boundary of the first patterns is defined as a first edge pattern, and the first dummy pattern is disposed adjacent to the first edge pattern, next, the first dummy pattern is removed, and afterwards, according to the target pattern, a plurality of second patterns are formed in the substrate, the second patterns comprises a second edge pattern that is disposed between the first edge pattern and an original position of the first dummy pattern.

The critical dimension of the patterns that near the boundary of the device region is unstable, for example, the size of the edge gate line pattern is easily enlarged, and touching the other components causes a short circuit. Especially in the SRAM pattern, since the gate line pattern is arranged in parallel with the contact pattern and the distance is close, the above mentioned short circuit problem is more likely to occur.

The present invention is characterized in that forming the additional dummy gate line pattern beside the edge gate line pattern, so as to avoid the problem that the size of the gate line pattern disposed at the outermost boundary is enlarged. After the gate line pattern and the dummy gate line pattern are formed, an additional etching process is performed, to remove the dummy gate line pattern, and the contact patterns are then formed. During the contact patterns are formed, since the size of the edge gate line pattern is not enlarged, so each contact pattern can be can be more easily formed between two adjacent gate line patterns.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
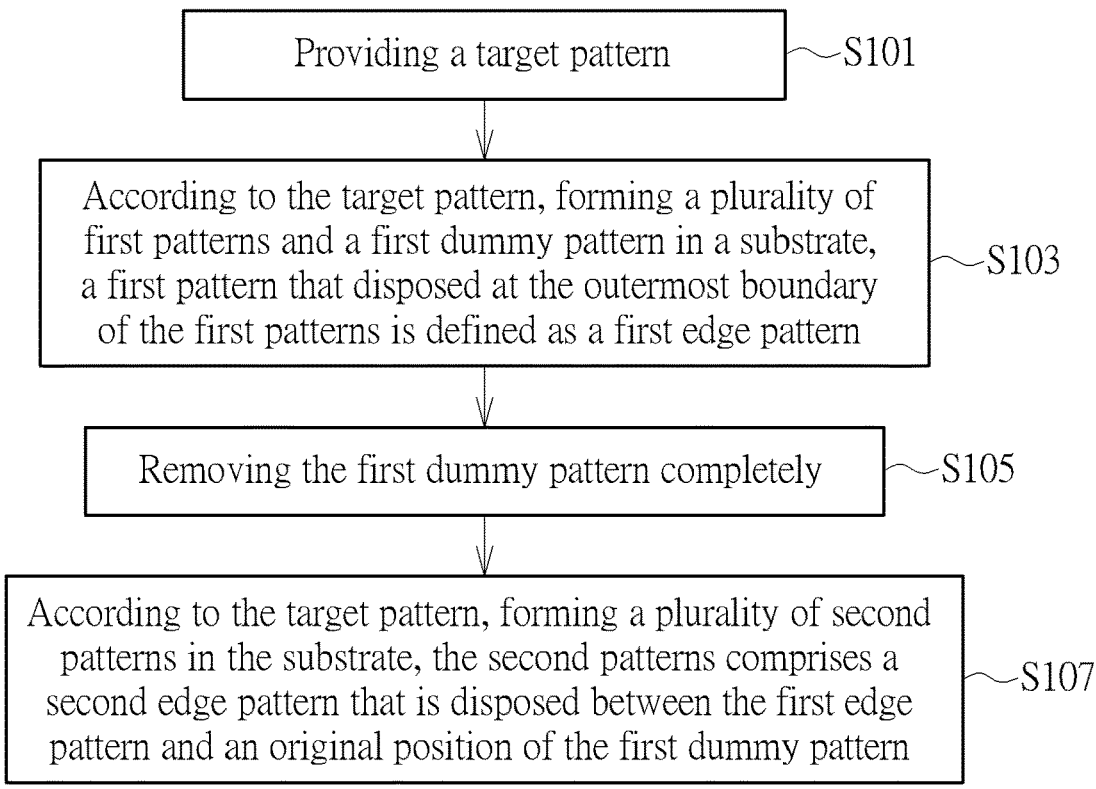
FIG. 1 shows the flow diagram of the present invention for forming a static random access memory (SRAM) pattern.

Please refer to FIG. 1, which shows the flow diagram of the present invention for forming a static random access memory (SRAM) pattern. As shown in FIG. 1, the method provided by the present invention includes at least the following steps: firstly, as shown in S101: providing a target pattern, the target pattern described here is the final pattern that will be formed later. Afterwards, as shown in S103: according to the target pattern, forming a plurality of first patterns and a first dummy pattern in a substrate, a first pattern that disposed at the outermost boundary of the first patterns is defined as a first edge pattern, and the first dummy pattern is disposed adjacent to the first edge pattern. Next, as shown in S105: removing the first dummy pattern completely, and as shown in S107: according to the target pattern, forming a plurality of second patterns in the substrate, the second patterns comprises a second edge pattern that is disposed between the first edge pattern and an original position of the first dummy pattern.

Figure 2:
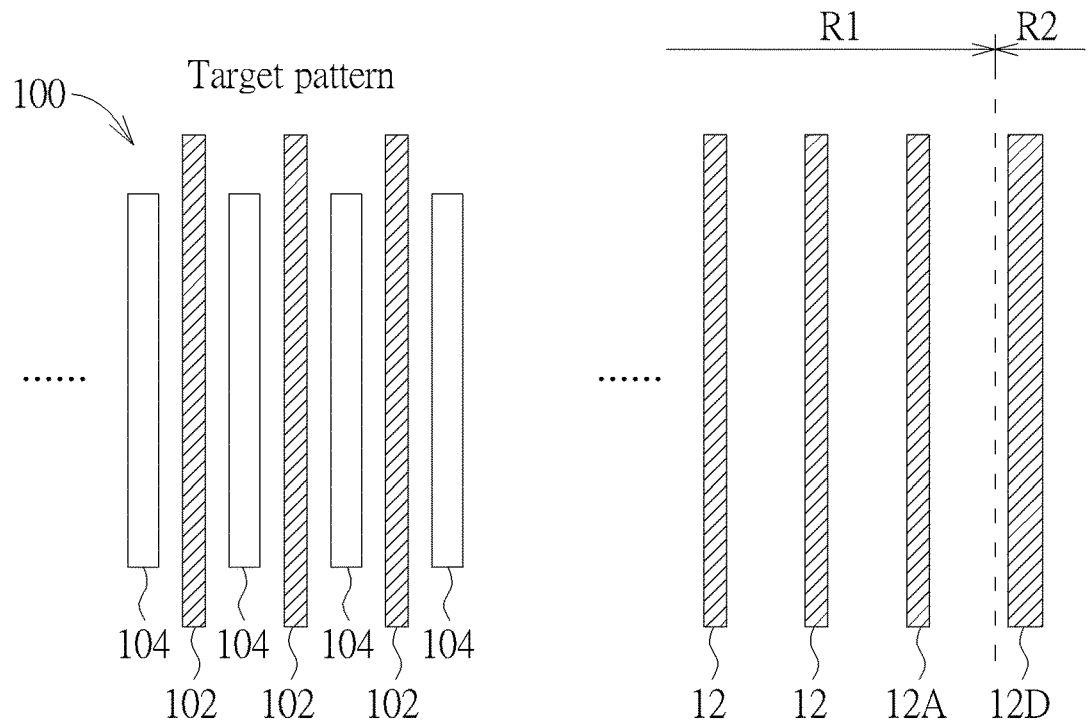
FIG. 2, FIG. 3 and FIG. 4 show the schematic diagrams of forming the SRAM pattern according to one preferred embodiment of the present invention.
Figure 3:
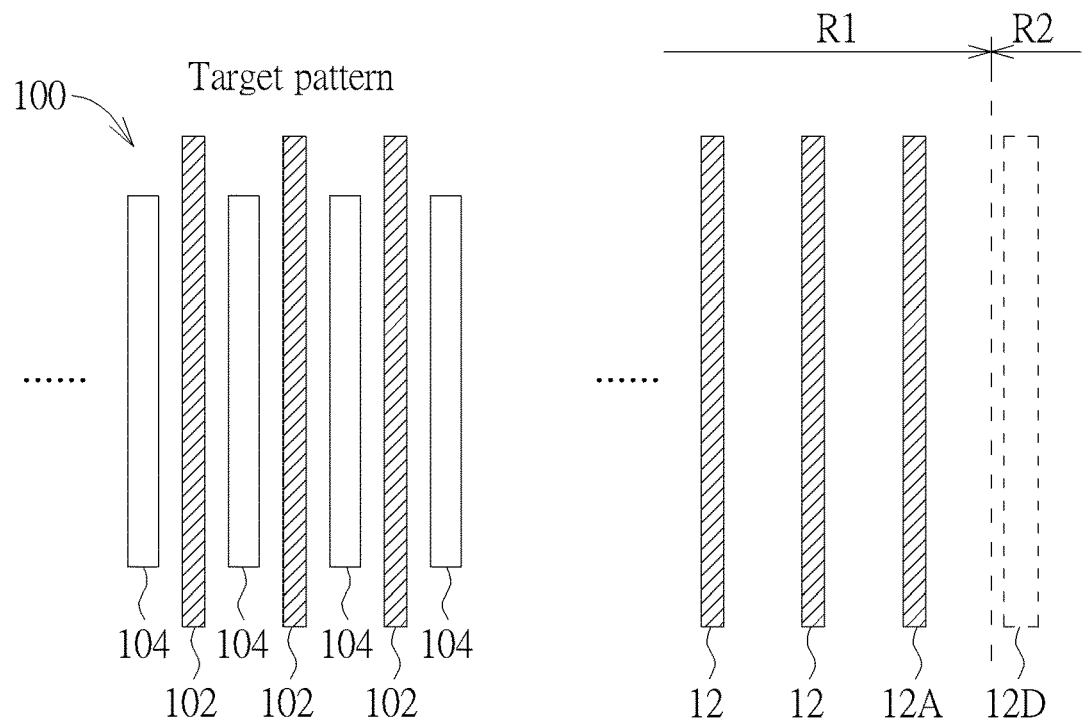
Figure 4:
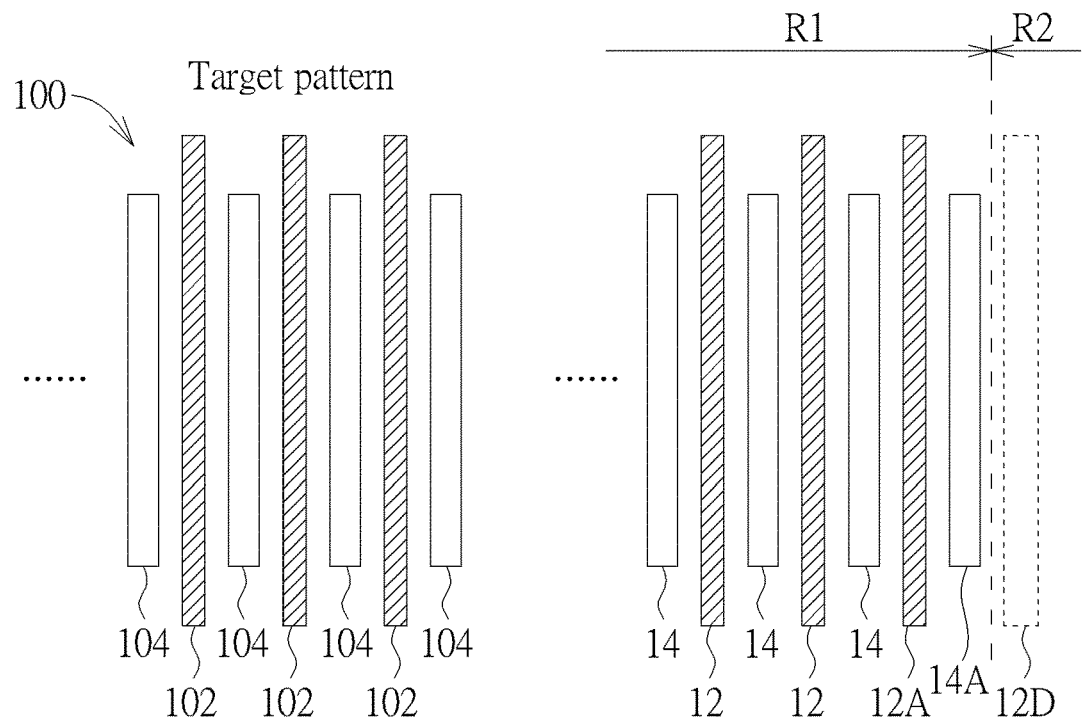

More precisely, please refer to FIGS. 2-4, which show the schematic diagrams of forming the SRAM pattern of the present invention. As shown in FIG. 2, a target pattern 100 is provided. In the following illustration, the target pattern 100 is shown on the left side of the figure, and the actual formed pattern is shown on the right side of the figure. However, the target pattern is provided only for the convenience of comparing the difference with the actual formed pattern. It does not mean that the target pattern and the will be on the substrate at the same time as the actual created pattern. The target pattern may include a plurality of gate lines 102 and a plurality of contact lines 104. Each gate line 102 is a long strip shaped pattern, arranged along a first direction (such as Y-axis), and arranged parallel to each other. Similarly, each contact line 104 is a long strip shaped pattern too, and also arranged along the first direction (such as Y-axis), and arranged parallel to each other. Besides, the gate lines 102 and the contact lines 104 are arranged alternately In other words, one gate line 102 is disposed between two adjacent contact lines 104. In addition, each gate line 102 does not contact the contact line directly. In the subsequent processes of the present invention, the gate lines 102 will be used as the gate structures in the SRAM. For example, it may be used as agate structures for pull-up transistors (PUs), pull-down transistors (PDs) or pass gate transistor (PG). On the other hand, the contact lines 104 may be used as the contact structures (such as the contact structures for electrically connecting to the word line, the bit line or other components) or the interconnection structure (for example, for electrically connecting the drains of the PL, PD and PG).

The left side of FIG. 2 shows the target pattern, and the right side of FIG. 2 shows the actual formed patterns of the present invention, in other words, it shows the schematic diagram of the processes for forming the target pattern of the present invention. Please refer to the right side of FIG. 2, firstly, according to the target pattern 100, a plurality of gate line patterns 12 are formed in a substrate 10. The gate line patterns 12 are same as the gate lines 102 of the target pattern 100. It should be noted that in the right side of FIG. 2, there is defined a device region R1 and a peripheral region R2. In the subsequent step, the SRAM pattern (including the gate line pattern 12 and the following formed contact line pattern) will mainly be formed in the device region R1, that is, the SRAM pattern is not necessary to form in the peripheral region R2. As mentioned above, when the device pattern is formed close to the boundary region (the edge of the device region R1), the critical dimension may be enlarged due to the uneven density of the element pattern. In some case, the pattern nears the boundary region will be enlarged, thus increasing the likelihood of contact with other surrounding components and causing a short circuit. Therefore, in the present invention, the one gate line pattern 12 that disposed within the device region R1 and adjacent to the boundary (edge) of the device region R1 and the peripheral region R2 is defined as an edge gate line pattern 12A, and at least one dummy gate line pattern 12D is formed within the peripheral region R2 and disposed beside the edge gate line pattern 12A. The dummy gate line pattern 12D is formed on the outer side of the edge gate line pattern 12A, replacing the edge gate line pattern 12A to be the outermost pattern. The purpose of forming the dummy gate line pattern 12D is to prevent the edge gate line pattern 12A from being located at the outermost side of the element pattern, and the size of the edge gate line pattern 12A is easily enlarged brought into contact with other elements (for example, a subsequently formed contact line pattern) to cause a short circuit. Therefore, as shown in FIG. 2, since the gate line patterns 12 and the edge gate line pattern 12A are not the outermost pattern, each gate line pattern 12 and the edge gate line pattern 12A have the same size (such as have the same width). In the embodiment of the present invention, since the dummy gate line pattern 12D is the outermost pattern, so the size of the dummy gate line pattern 12D is larger than other gate line patterns 12 and edge gate line pattern 12A.

Next, as shown in FIG. 3, after the gate line pattern 12 (including the gate line pattern 12 and the edge gate line pattern 12A) and the dummy gate line pattern 12D are formed, an etching process is performed, to remove the dummy gate line pattern 12D completely. It is worth noting that the gate line pattern 12 and the dummy gate line pattern 12D are formed are formed simultaneously, and after the dummy gate line pattern 12D is formed, the etching process is then performed to remove the dummy gate line pattern 12D. Therefore, the remained gate line pattern 12 is same as the gate lines 102 shown in the target pattern.

Afterwards, as shown in FIG. 4, a plurality of contact patterns 14 are formed. Both the gate line patterns 12 and the contact patterns 14 are arranged along a same direction (such as Y-axis), in addition, the gate line patterns 12 and the contact patterns 14 are arranged alternately and parallel to each other. In this embodiment, the outermost contact pattern 14 (near the boundary of the device region R1 and the peripheral region R2) is defined as an edge contact pattern 14A. The edge contact pattern 14A is disposed between the edge gate line pattern 12A and the original position of the dummy gate line pattern 12D. In this step, the gate line patterns 12 and the contact patterns 14 compose the same pattern as the target pattern 100.

As mentioned above, the critical dimension of the patterns that near the boundary of the device region is unstable, for example, the size of the edge gate line pattern 12A is easily enlarged, and touching the other components causes a short circuit. Especially, in the SRAM pattern, since the gate line pattern 12 is arranged in parallel with the contact pattern 14 and the distance is close, the above mentioned short circuit problem is more likely to occur. The present invention is characterized in that forming the additional dummy gate line pattern 12D beside the edge gate line pattern 12A, so as to avoid the problem that the size of the gate line pattern disposed at the outermost boundary is enlarged. After the gate line pattern 12 and the dummy gate line pattern 12D are formed, an additional etching process is performed, to remove the dummy gate line pattern 12D, and the contact patterns 14 are then formed. During the contact patterns 14 are formed, since the size of the edge gate line pattern 12A is not enlarged, so each contact pattern 14 can be can be more easily formed between two adjacent gate line patterns 12.

The following description will detail the different embodiments of the method of designing a layout of a static random access memory (SRAM) pattern of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 5:
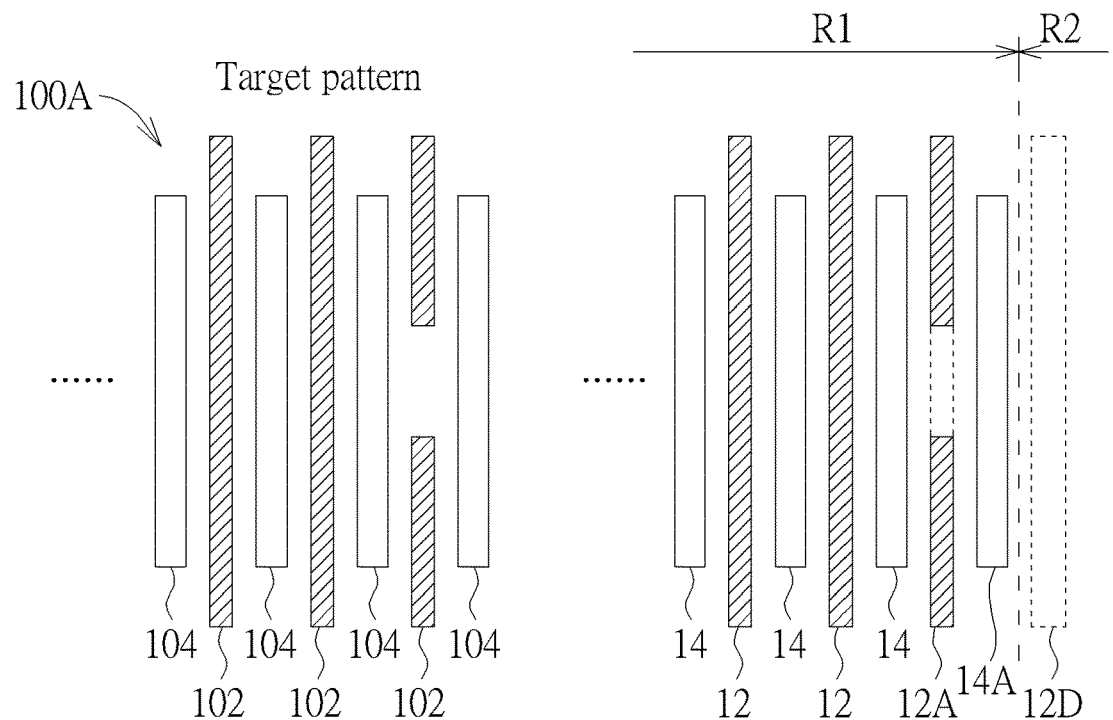
FIG. 5 and FIG. 6 respectively illustrate schematic diagrams according to different embodiments of the present invention.
Figure 6:
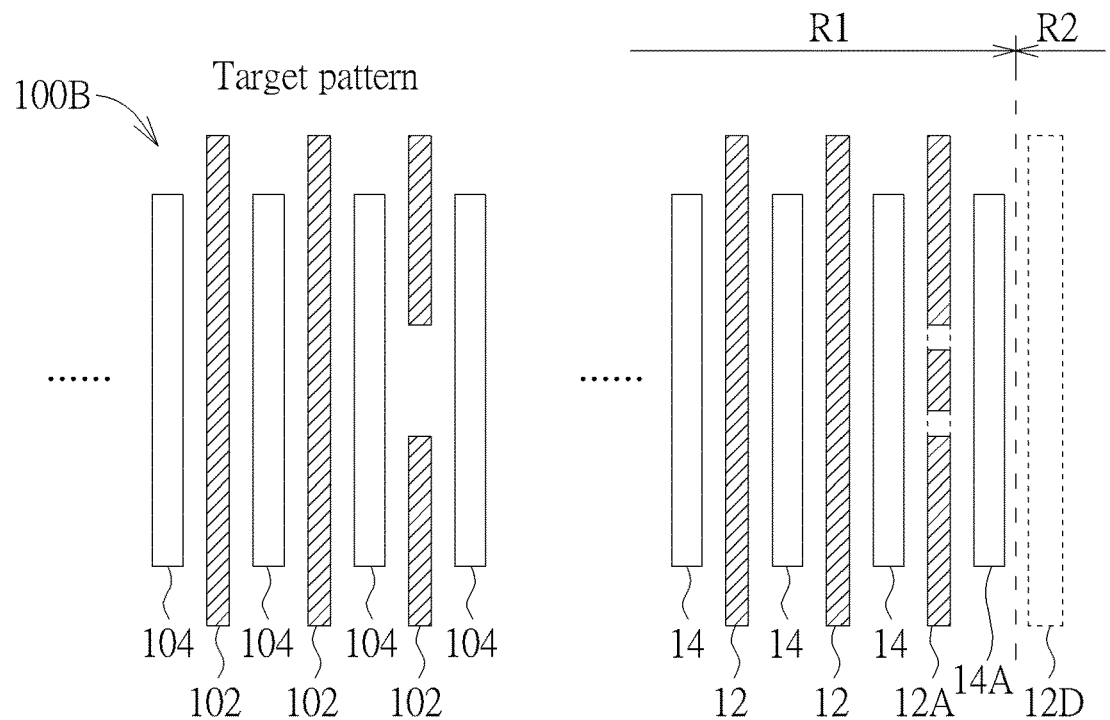

In other embodiment of the present invention, please refer to FIG. 5 and FIG. 6, FIG. 5 and FIG. 6 respectively illustrate schematic diagrams of different embodiments of the present invention. During the process for removing the dummy gate line pattern 12D, parts of the gate line pattern 12 may also be removed at the same time. For example, a gate cutting process may be performed, to split the gate line into different segments. In this embodiment, the etching process removes the dummy gate line pattern 12D and partially removes the edge gate line pattern 12A. However, in another case of the present invention, the etching process can further remove parts of the gate line pattern 12 too. Besides, after the etching process is performed, as shown in FIG. 5, the dummy gate line pattern 12D and parts of the gate line pattern 12 are removed (in FIG. 5, the removed part is indicated by the dashed line), and after the contact patterns 14 are formed, the pattern on the right side of FIG. 5 will be the same as the pattern on the left side of FIG. 5 (the target pattern 100A). However, in another case of the present invention, as shown in FIG. 6, after the dummy gate line pattern 12D and parts of the gate line pattern 12 are removed (in FIG. 6, the removed part is indicated by the dashed line), and after the contact patterns 14 are formed, the pattern on the right side of FIG. 6 will be different from the pattern on the left side of FIG. 6 (the target pattern 100B). It should also be within the scope of the present invention.

Figure 7:
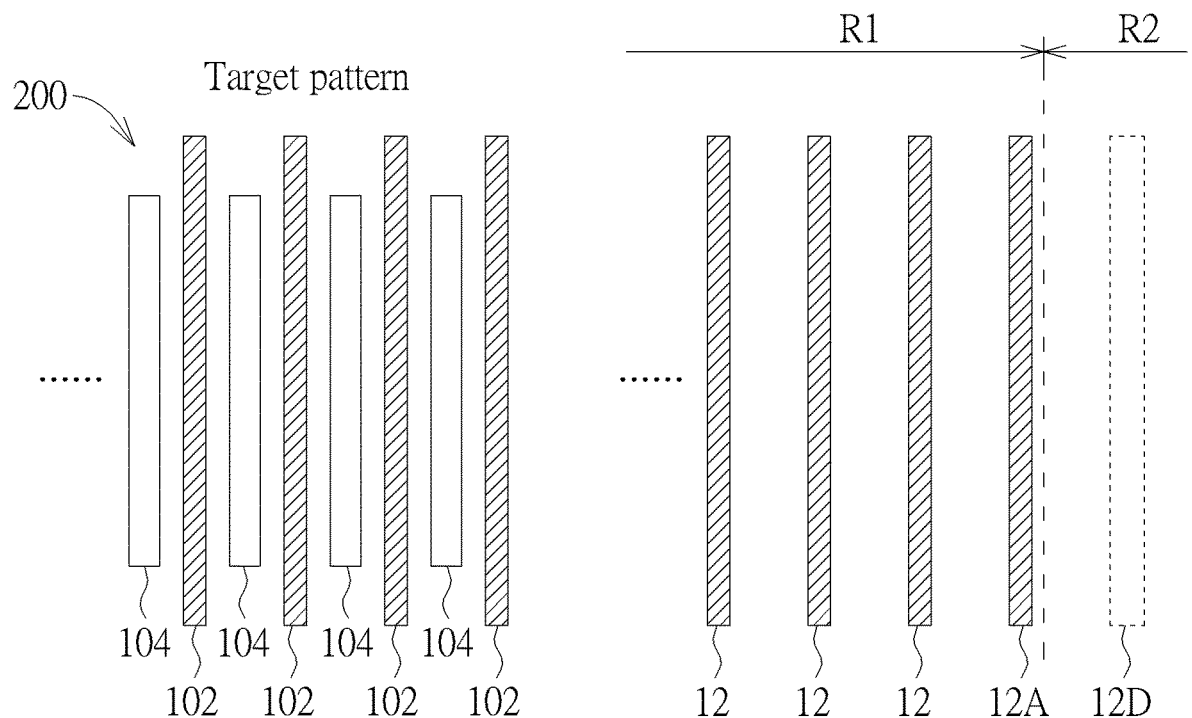
FIG. 7 and FIG. 8 illustrate schematic diagrams according to another embodiment of the present invention.
Figure 8:
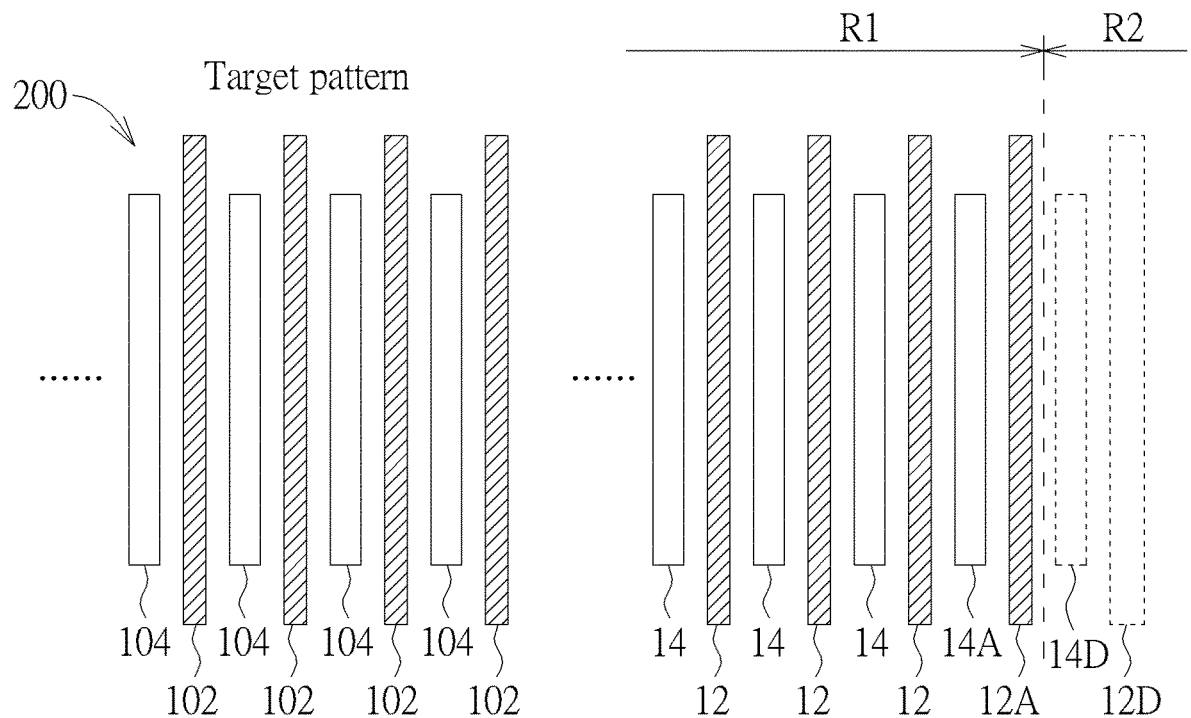

In another embodiment of the present invention, please refer to FIGS. 7-8, FIG. 7 and FIG. 8 illustrate schematic diagrams according to another embodiment of the present invention. As shown in FIG. 7, during the process for forming the contact pattern 14, in order to avoid the problem of size expansion of the contact pattern located in the boundary area, therefore, an additional dummy contact pattern 14D is also formed next to the edge contact pattern 14A. Afterwards, as shown in FIG. 8, a second etching process is performed, so as to remove the dummy contact pattern 14D completely. Besides, after the dummy contact pattern 14D is removed, the pattern on the right side of FIG. 8 may be the same as or may be different from the pattern on the left side of FIG. 8 (the target pattern 200). It should also be within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of designing a layout of a static random access memory (SRAM) pattern, comprising:
   according to a target pattern, forming a plurality of first patterns and a first dummy pattern in a substrate, wherein a first pattern that disposed at the outermost boundary of the first patterns is defined as a first edge pattern, and the first dummy pattern is disposed adjacent to the first edge pattern, wherein a size of the first dummy pattern is larger than a size of each first pattern;
   removing the first dummy pattern completely; and
   according to the target pattern, forming a plurality of second patterns in the substrate, wherein the second patterns comprise a second edge pattern that is disposed between the first edge pattern and an original position of the first dummy pattern.

2. The method of claim 1, wherein after the first dummy pattern is removed, the second edge pattern is disposed at the outermost boundary of the SRAM pattern.

3. The method of claim 1, wherein each first pattern is a gate structure of the SRAM pattern, and each second pattern is the contact structure of the SRAM pattern.

4. The method of claim 1, further comprising:
   removing parts of the first edge pattern during the step for removing the first dummy pattern.

5. The method of claim 4, wherein after the first edge pattern is partially removed, the first patterns, the first edge pattern and the second patterns constitute a manufacturing pattern, and the manufacturing pattern is same as the target pattern.

6. The method of claim 4, after the first edge pattern is partially removed, the first patterns, the first edge pattern and the second patterns constitute a manufacturing pattern, and the manufacturing pattern is different from the target pattern.

7. The method of claim 1, wherein the first patterns comprising a plurality of long strip shaped patterns arranged parallel to each other.

8. The method of claim 7, wherein the second patterns comprising a plurality of long strip shaped patterns arranged parallel to each other, and each second pattern does not contact the first pattern directly.

9. The method of claim 8, wherein when viewed from a top view, the first patterns and the second patterns are arranged alternately and parallel to each other.

10. A method of designing a layout of a static random access memory (SRAM) pattern, comprising:
according to a target pattern, forming a plurality of first patterns and a first dummy pattern in a substrate, wherein a first pattern that disposed at the outermost boundary of the first patterns is defined as a first edge pattern;
removing the first dummy pattern completely;
according to the target pattern, forming a plurality of second patterns and a second dummy pattern in the substrate, wherein the second dummy pattern is disposed between the first edge pattern and an original position of the first dummy pattern; and
removing the second dummy pattern completely.

11. The method of claim 10, wherein after the first dummy pattern and the second dummy pattern are removed, the first edge pattern is disposed at the outermost boundary of the SRAM pattern.

12. The method of claim 10, wherein each first pattern is a gate structure of the SRAM pattern, and each second pattern is the contact structure of the SRAM pattern.

13. The method of claim 10, further comprising:
defining a second pattern that disposed at the outermost boundary of the second patterns as a second edge pattern; and
removing parts of the second edge pattern during the step for removing the second dummy pattern.

14. The method of claim 13, wherein after the first edge pattern is partially removed, the first patterns, the first edge pattern, the second patterns and the second edge pattern constitute a manufacturing pattern, and the manufacturing pattern is same as the target pattern.

15. The method of claim 13, wherein after the first edge pattern is partially removed, the first patterns, the first edge pattern, the second patterns and the second edge pattern constitute a manufacturing pattern, and the manufacturing pattern is different from the target pattern.

16. The method of claim 10, wherein the first patterns comprising a plurality of long strip shaped patterns arranged parallel to each other.

17. The method of claim 16, wherein the second patterns comprising a plurality of long strip shaped patterns arranged parallel to each other, and each second pattern does not contact the first pattern directly.

18. The method of claim 17, wherein when viewed from a top view, the first patterns and the second patterns are arranged alternately and parallel to each other.

19. The method of claim 10, wherein a size of the first dummy pattern is larger than a size of each first pattern.

* * * * *